Oct. 12, 1965 WEN-HSIUNG KO 3,212,027

TUNNEL DIODE FREQUENCY MODULATOR AND TRANSMITTER SYSTEM

Filed Oct. 20, 1961

INVENTOR.
WEN-HSIUNG KO

BY Stowell & Stowell

ATTORNEYS

United States Patent Office 3,212,027

Patented Oct. 12, 1965

3,212,027

TUNNEL DIODE FREQUENCY MODULATOR AND TRANSMITTER SYSTEM

Wen-Hsiung Ko, Cleveland Heights, Ohio, assignor to Research Corporation, New York, N.Y., a corporation of New York Filed Oct. 20, 1961, Ser. No. 146,589

8 Claims. (Cl. 332—16)

The present invention relates to the use of a negative resistance characteristic of a semiconductor device to perform multi-functions in communication circuits such as performing the function of oscillator, modulator and amplifier, and has particular reference to an improved tunnel diode AM and FM circuits which utilize only one negative resistance element with the outstanding advantage of miniaturizing electronic equipment.

In considering the possibility of devising multi-function circuits, it has been found that the separation of signals into different functions is a substantial problem. Unless the mixing of signals is desired, or the separation of signals can be achieved by established techniques, the multi-function circuit has been found to be incapable of producing any useful results. Since the separation of signals with large frequency differences is a well known technique, multi-function circuits involving signals of different frequencies are possible with the application of the present invention.

The tunnel diode is one of the useful semiconductors having a negative resistance characteristic that may be used in a circuit according to the present invention. Besides the several desired properties of tunnel diodes such as being responsive to substantial and rapid changes in frequency, and the well known quality of compactness afforded by the tunnel diode, it differs from other electronic active devices in that it is a two-terminal bilateral element. The tunnel diode is a negative resistance device with no preferred direction of signal flow. This unique characteristic or property is commonly thought of in other equipment as undesirable, such as in amplifiers and switching circuits where it presents the difficult problem of coupling and isolation of the output from the input. In the present invention this property is used to an advantage to obtain multi-function circuits. In a converter a tunnel diode is used as an intermediate-frequency amplifier, local oscillator, mixer and low- or audio-frequency amplifier. In an oscillator a tunnel diode may be used to couple two or more resonant circuits to produce oscillations of different frequencies and harmonics thereof.

Perhaps the outstanding advantage of the new circuit resides in a FM oscillator-modulator unit using a single tunnel diode capable of producing a frequency deviation of 100 kc. per millivolt of modulating signal without any variable reactance element. One embodiment of the FM unit fed from a dynamic microphone has been found to have a range of 50–100 feet. The tunnel diode is used simultaneously as the audio frequency amplifier and a gain of 3 to 5 has been obtained.

Accordingly, the present invention is directed to a semiconductor having a negative resistance characteristic used in a circuit as a carrier-oscillator, and having a bias circuit to which the modulating signal is applied. The frequency of the oscillator varies according to the signal. The high sensitivity of the frequency modulation circuit is due to the non-linearity of the negative resistance of the semiconductor characteristics. The semi-conductor is designed to operate near one of the non-linear regions depending upon the bias applied in the circuit. When the combined signal overcomes the instantaneous bias, the output of the semi-conductor is derived from the non-linear region which changes the frequency to a lower value, while when the signal drives the bias away from the non-linear region, the frequency is modulated upward.

It is an object of the present invention to provide a means to produce frequency modulated radio waves in a multi-function circuit producing good quality and high sensitivity. It is a further object of the invention to provide a miniature FM transmitter of few components and adaptable to miniaturization. It is another object of the invention to provide an FM transmitter requiring a power supply of very small capacity so that the transmitter may be supplied by energy resulting from direct conversion from light, sound, heat or chemical sources.

It is still another object of the invention to provide an FM telemetering system adaptable to withstand shock, vibration and noise.

With the new arrangement it is possible to provide means for producing FM signals in oscillators using any non-linear negative resistance device by varying the bias voltage in a multi-function circuit. The preferred embodiment of the invention uses a tunnel diode as an oscillator-modulator and signal amplifier concurrently.

A further embodiment of the invention uses a cascade circuit arrangement to increase power output of the FM modulator transmitter.

These and other objects and advantages which are inherent in the invention will become apparent from the following description when considered in light of the accompanying drawing wherein.

Figure 1:
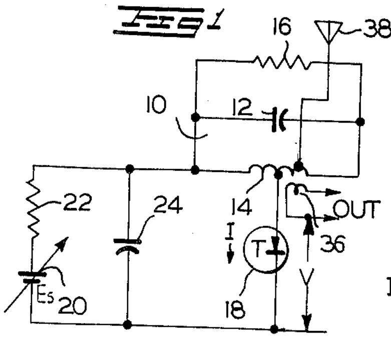
FIG. 1 is a detailed circuit diagram of the tunnel diode oscillator circuit of the present invention.
Figure 1A:
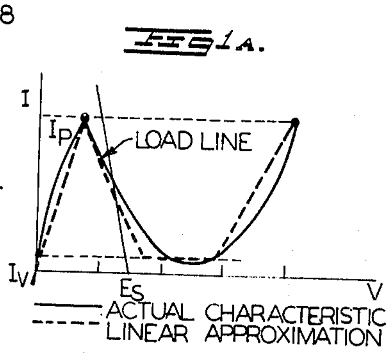
FIG. 1A illustrates the static characteristic of a tunnel diode.

Referring now to FIG. 1, there is shown an oscillator circuit 10 including a capacitive reactance 12 and an inductive reactance 14. Any inherent resistance or added resistance applied to the oscillator circuit is shown in resistance 16 coupled in shunt relation across the resonant circuit 12, 14. Connected to one point of the resonant circuit 12, 14 is a bias-sensitive means 18 having a reactive value and also having a negative resistance region as shown in FIG. 1A. The bias-sensitive means in the preferred embodiment of the invention is a tunnel diode in which the static characteristic thereof and its sectional linearized approximate characteristic are shown also in FIG. 1A, together with the D.C. load line.

In the preferred embodiment of the invention the negative resistance device is shown as a voltage controlled device which may be a dielectric device, a dynatron, as well as a tunnel diode, or the bias-sensitive means may be a current controlled device having a negative resistance characteristic such as a point contact semiconductor, an avalanche device, a four-layer semiconductor device, a unijunction device or even a gas tube with corresponding characteristics.

In FIG. 1 a D.C. supply 20 is connected to bias the tunnel diode 18 in its negative resistance region. A resistance 22 having a value smaller than the value of minimum negative resistance of the tunnel diode 18 is connected in series with the D.C. supply 20. A capacitor 24 is connected across the series arrangement of the D.C. supply 20 and resistance 22.

Figure 1B:
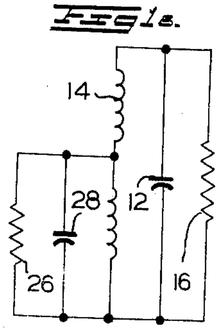
FIGS. 1B and 1C represent equivalent circuits of the tunnel diode oscillator of FIG. 1.
Figure 1C:
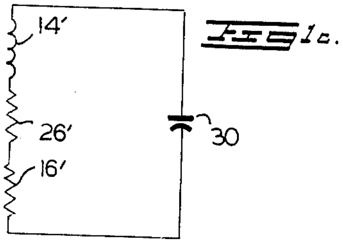
Figure 1D:
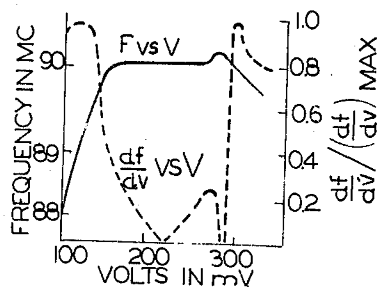
FIG. 1D shows a plot of frequency and $dF/dV$ with respect to bias in a tunnel diode used in the present invention.

FIG. 1B shows the A.C. equivalent circuit of the oscillator using the linearized characteristic, which may in turn be further simplified into an equivalent series resonant circuit as depicted in FIG. 1C.

Figure 2:
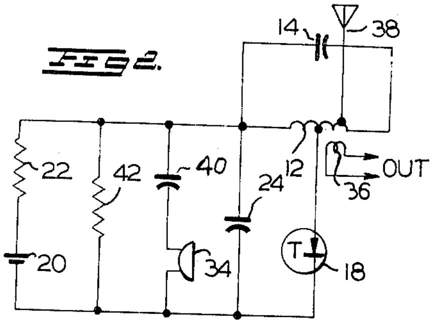
FIG. 2 shows a detailed circuit diagram of a modulator-transmitter circuit having an FM oscillator using the tunnel diode arrangement in accordance with the present invention.
Figure 3:
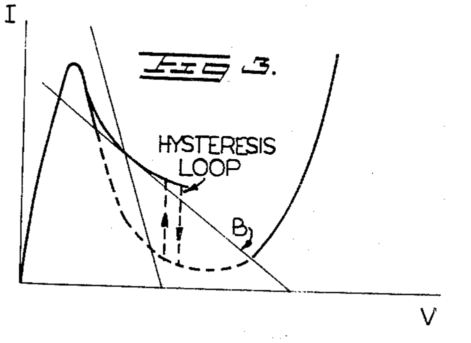
FIG. 3 illustrates a plot of the D.C. characteristics of a tunnel diode oscillator in which the dashed curve indicates to the characteristic with no oscillation.

The tunnel diode 18 is shown in FIG. 1B as having a negative resistance 26 and a capacitance value 28 connected in shunt relation to a portion of the inductive reactance of the resonant circuit 12, 14. In FIG. 1C the series resonant component include inductance 14′, resistance 16′, negative resistance 26′ and a total capacitance 30 including the capacitance characteristic of the tunnel diode and of the resonant circuit. It is found that the actual frequency of the oscillator circuit 10 precisely depends upon the resistance and capacitance of the tunnel diode, as well as the nonlinear characteristic of the diode in the range of voltage and current applied by the D.C. supply 20 as well as the voltage and current swing of the existing oscillations of the resonant circuit 12, 14. The reactance and resistance values of the oscillator circuit 10 are maintained constant. The reactance values of the tunnel diode as controlled by the D.C. supply 20 and the oscillating currents of the resonant circuit are controlled to vary the frequency of the oscillator circuit. The capacitance of the tunnel diode decreases with increasing bias applied by the D.C. supply, if made variable as shown in FIG. 2 providing a microphone transducer 34 to modulate the bias of D.C. supply 20, where the bias is applied in the negative resistance region of the tunnel diode. Where the resistance and the nonlinearities of the tunnel diode remain constant, the frequency increases with increased bias applied from the signals of microphone transducer 34 applied to the tunnel diode. Further, it is important that the nonlinearity of the positive resistance region of the tunnel diode characteristic be preserved, since it has an important role in determining the relationship of the frequency change controlled by the tunnel diode with respect to the applied bias voltage.

FIG. 2 shows a modulator circuit of an FM oscillator, to which there may be provided an inductive output 36 or a radiating antenna 38 for propagating the resonating energy of the oscillation circuit 10. A blocking capacitor 40 may be connected in circuit relation with the microphone transducer 34. The microphone converts sound energy into a modulating voltage which is applied across the bias resistance 22, 42 and is thence applied to the tunnel diode. By this means the tunnel diode produces the frequency deviation, as described above. The circuit provides uniform modulation over a wide band until stray capacitance of the circuit substantially deteriorates the effective values of the input signal.

Where the bias resistance 22, 42 is substantially equal in value to the negative resistance of the tunnel diode, the gain of the tunnel diode is found to be improved so that amplification results in the modulation of the signal impressed upon the resonant circuit. When the input signal from the microphone is limited to small relative values, a gain of 5 times such input signal is obtained from the amplification characteristic of the tunnel diode.

Figure 4:
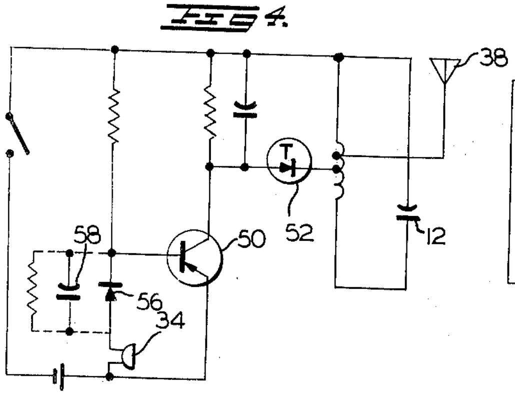
FIG. 4 shows a detailed circuit diagram including a transistor to amplify signals in a tunnel diode modulator-transmitter in accordance with a modification of the present invention.

FIG. 4 shows applying a transistor 50 to further amplify audio signals and at the same time to provide a bias for the tunnel diode 52.

For practical applications, the dynamic range of audio signals should be made substantially large. To obtain reliable and stable operation, the audio frequency amplifier function of the tunnel diode, as described above, is not used to its full capacity as shown in FIG. 4. The modulator transmitter circuit shown in FIG. 4 has been constructed and has generally a range of about 50 feet with substantially no noise. Frequency response characteristics with and without a de-emphasis circuit have been described in Electronics, of November 18, 1960. If pre-emphasis is desirable, diode 56 is then replaced by the RC parallel circuit 58 shown in dotted lines in FIG. 4.

Figure 5:
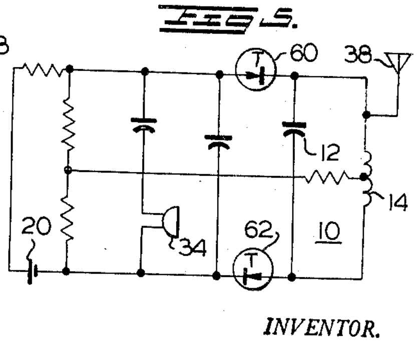
FIG. 5 shows a detailed circuit diagram of an FM transmitter using two tunnel diodes in cascade in accordance with a further modification of the present invention.

FIG. 5 shows an arrangement for increasing the radio frequency output and to extend the transmission range of the modulator transmitter using an oscillator having two cascade connected germanium tunnel diodes 60, 62.

It will thus be apparent that the new circuit apparatus may conveniently operate to perform multi-functions including that of amplification, modulation, and oscillation control so that a conveniently compact and simply constructed circuit may be constructed.

In accordance with the provisions of the patent statutes I have explained the principle and mode of operation of my invention and have illustrated and described what is now considered to represent its best embodiments. However, I desire to have it understood that, within the scope of the appended claims, the invention may be practiced otherwise than as specifically illustrated and described.

I claim:

1. A radio circuit comprising a radio frepuency resonant tank circuit including a capacitive reactance and an inductive reactance, a semiconductor having a negative resistance characteristic and having two terminals, one of which is connected to an intermediate point of said inductive reactance and the other connected to a reference point, and means to sensitively bias the semiconductor in its negative resistance region in which one terminal thereof is connected to the tank circuit and the other terminal is connected to the reference point whereby the frequency of the tank circuit is linearly varied in accordance with the change in bias of the bias means.

2. A radio circuit comprising a radio frequency resonant tank circiut including a capacitive reactance and an inductive reactance, a tunnel diode having a negative resistance characteristic and having two terminals, one of which is connected to an intermediate point of said inductive reactance and the other connected to a reference point, and means to sensitively bias the tunnel diode in its negative resistance region in which one terminal thereof is connected to the tank circuit and the other terminal is connected to the reference point whereby the frequency of the tank circuit is linearly varied in accordance with the change in bias of the bias means.

3. The radio circuit of claim 1 wherein a resistance is connected in shunt relation to the tank circuit, and a resistor is connected in circuit with the bias means having a value less than the minimum negative resistance value of the semiconductor.

4. A combination oscillation modulation circuit comprising an inductance and a capacitance forming a resonant circuit, bias-sensitive means having a negative resistance characteristic with one terminal thereof connected to an intermediate point of said inductance and the other terminal thereof connected to a reference point, bias means providing a variable bias to said bias-sensitive means with respect to said reference point for correspondingly varying the reactance of said bias-sensitive means when the applied bias is varied in the negative resistance region thereof, and producing thereby a linear variation in the frequency of the oscillation circuit.

5. A combination oscillation-modulation circuit comprising an inductance and a capacitance forming a resonant circuit, bias-sensitive means having an inherent capacitance, a nonlinear positive resistance region, and a negative resistance region distinct from said non-linear positive resistance region, one terminal of the bias-sensitive means connected to an intermediate point of said inductance of said resonant circuit, bias means coupled in shunt relation to the bias-sensitive means, said resonant circuit, said bias-sensitive means, and said bias means being interconnected in a series circuit; said bias-senistive means decreasing in capacitance upon an increase in bias in the negative resistance region and linearly increasing the frequency of the resonant circuit upon said increase in bias.

6. The circuit of claim 5 wherein the bias-sensitive means increases the gain of the frequency signal of the resonant circuit.

7. The circuit of claim 5 wherein the bias means includes means for converting acoustic energy to a variable voltage in response to the acoustic energy.

8. The circuit of claim 5 wherein the bias-sensitive means is a tunnel diode.

References Cited by the Examiner

UNITED STATES PATENTS

| | | | |
|---|---|---|---|
| 2,406,804 | 9/46 | Chatterjea et al. | 331—107 |
| 2,986,724 | 5/61 | Jaeger | 331—107 X |
| 2,997,604 | 8/61 | Shockley | 332—16 |
| 3,056,048 | 9/62 | McGrogan | 307—88.5 |
| 3,061,790 | 10/62 | Theriault | 307—88.5 |
| 3,134,949 | 5/64 | Tiemann | 332—30 |

FOREIGN PATENTS

| | | |
|---|---|---|
| 158,879 | 9/54 | Australia. |

OTHER REFERENCES

Sommers, Proceedings of the I.R.E., July 1959, pages 1201–1206.

ROY LAKE, *Primary Examiner*.

ARTHUR GAUSS, ALBERT L. BRODY, *Examiners*.